(12) United States Patent
Lee

(10) Patent No.: US 6,350,650 B1
(45) Date of Patent: Feb. 26, 2002

(54) METHOD FOR FABRICATING A SEMICONDUCTOR MEMORY DEVICE

(75) Inventor: Pyung Woo Lee, Kyonggi-do (KR)

(73) Assignee: Hyundai Electronics Industries Co., Ltd., Kyoungki (KR)

( * ) Notice: Subject to any disclaimer, the term of this patent is extended or adjusted under 35 U.S.C. 154(b) by 0 days.

(21) Appl. No.: 09/710,958

(22) Filed: Nov. 14, 2000

(30) Foreign Application Priority Data

Apr. 3, 2000 (KR) .............................................. 00-17401

(51) Int. Cl.[7] .......................................... H01L 21/8242
(52) U.S. Cl. ...................................... 438/256; 438/240
(58) Field of Search ................................ 438/240, 239, 438/253, 256

(56) References Cited

U.S. PATENT DOCUMENTS

| | | | |
|---|---|---|---|
| 5,981,330 A | 11/1999 | Jenq | 438/238 |
| 6,150,689 A * | 11/2000 | Narui et al. | 257/306 |
| 6,235,572 B1 * | 5/2001 | Kunitomo et al. | 438/240 |

* cited by examiner

Primary Examiner—Michael S. Lebentritt
Assistant Examiner—Brad Smith
(74) Attorney, Agent, or Firm—Fleshner & Kim, LLP

(57) ABSTRACT

A method of fabricating a semiconductor memory device is provided. In accordance with preferred embodiments of methods of the present invention, a cell array region and a peripheral circuitry region are defined by forming a field region on the surface of a semiconductor. In the cell array region, a number of wordlines are formed at a predetermined interval. Each region demarcated by the wordlines is filled with a semiconductor material in which source region, drain region and contact regions for connection between capacitors and bitlines are formed. Then, exposed entire surfaces in the cell array region and in the peripheral circuitry region are planarized. On the planarized surface, bitlines are formed without forming bitline contacts. In order to insulate the bitlines from each other, an insulation sidewall spacer is formed on each sidewall of the bitlines.

22 Claims, 15 Drawing Sheets photo-resist for bit line

METHOD FOR FABRICATING A SEMICONDUCTOR MEMORY DEVICE

BACKGROUND OF THE INVENTION

1. Field of the Invention

The present invention relates to a semiconductor memory device fabrication method, more particularly to a method of fabricating bitlines for a semiconductor memory device.

2. Background of the Related Art

Related art DRAM structures include a bitline lower portion structure using an Elevated Silicon Layer (ESL), a bitline lower portion structure using a Poly Plug, and a Self Aligned Contact structure. The bitline structures using the Elevated Silicon Layer and the Poly Plug have bitline contacts.

Three related art structures will now be described. First, a Silicon Epitaxial Growing Type of the Elevated Silicon Layer structure (ESL) will be described. The process for forming bitline lower portion structure of Epitaxial Growing Type in a related art DRAM fabrication is shown in FIG. 1A to FIG. 1D.

As shown in FIG. 1A, in order to manufacture a transistor, an isolation process is performed on a silicon substrate 1 to form an active region 2 and a field region 3. After the isolation process is performed, a gate oxide film 4 is formed on the silicon substrate 1, and then a wordline is formed thereon.

In order to form the wordline, polysilicon 5, wordline conductor 6 and wordline insulator 7 are sequentially deposited, and then a photolithography process is performed on the wordline insulator 7 to provide a photoresist pattern. Using the photoresist pattern as a mask, the wordline insulator 7, the wordline conductor 6, the polysilicon 5 and the gate oxide film 4 are etched to form a wordline 10.

As shown in FIG. 1B, when a photolithography process and an etching process are performed after an insulation film 8 has been deposited, insulation sidewall spacers 9 are formed on sidewalls of the wordlines by a reactive ion etching process that etches only a portion of the insulation film 8 corresponding to the active region 2. As shown in FIG. 1C, a silicon layer 11 is grown only on an exposed portion of the active region 2. The silicon layer 2 grown in this manner is referred to as an Elevated Silicon Layer.

After an insulation film has been deposited, a chemical mechanical polishing process is performed on the exposed entire surface so the exposed surface is planarized, and then, an interlayer dielectric film 12 is deposited on the planarized entire surface. The chemical mechanical polishing process is performed until the entire surface of the wordline is exposed. Subsequently, a contact photolithography process and an etching process are sequentially performed on the interlayer dielectric film 12 so that a contact 13 for connecting the grown silicon layer 11 and a bitline is made on the active region 2.

As shown in FIG. 1D, a bitline barrier 14, a bitline conductor 15, and a bitline insulation film 16 are sequentially formed on entire surface of the interlayer dielectric film 12 including the contact 13.

As shown in FIG. 2A to FIG. 2D, the process for forming a bitline lower portion structure of polysilicon plug type in a related art DRAM fabrication will now be described. As shown in FIG. 2A, to make a transistor, an isolation process is performed on a silicon substrate 21 so that the surface of the silicon substrate 21 is divided into an active region 22 and a field region 23.

After the isolation process has been performed, a gate oxide film 24 is grown on the silicon substrate 21, and then wordlines 28 are formed on the gate oxide film 24. As shown in FIG. 2a, each of the wordlines includes a first conductor 25, a second conductor 26 and a wordline insulation film 27 on its upper surface.

As shown in FIG. 2B, an insulation film is deposited on an exposed entire surface including the wordlines 28, and then insulation sidewall spacers 29 are formed on sidewalls of the wordlines 28 by a reactive ion etching process. A silicon layer 30 is deposited on the substrate 21 exposed between the wordlines 28 corresponding to the active region 22. To expose the active region corresponding to a source region and to a drain region, a photolithography process and an etching process are sequentially performed (not shown).

As shown in FIG. 2C, an insulation film (not shown) is deposited on an entire surface including the wordlines 28 and the silicon layer 30. Thereafter, the exposed entire surface is planarized by a chemical mechanical polishing process.

An interlayer dielectric film 31 is then deposited on the planarized entire surface. A photolithography process and an etching process for a bitline contact are sequentially performed (not shown) so that a bitline contact 32 is formed on the interlayer dielectric film 31.

As shown in FIG. 2D, a bitline barrier 33, a bitline material 34, and a bitline insulation film 35 are sequentially deposited on the interlayer dielectric film 31 including the bitline contact 32. Thereafter, a photolithography process and an etching process are sequentially performed to complete a bitline 36.

As shown in FIG. 3A to FIG. 3B, the process for forming bitline structure of a self aligned contact type in a related art DRAM fabrication will now be described. As illustrated in FIG. 3A, to make a transistor, an active. region 42 and a field region 43 are identified on a silicon substrate 41 by an isolation process. After the isolation process has been performed, a gate oxide layer 44 is grown on the entire silicon substrate 41 and then wordlines 45 are formed on the oxide film 44. Each wordline 45 includes a first conductor 46, a second conductor 47 and a wordline insulation film 48.

Referring to FIG. 3B, an insulation film 50 is deposited on the wordlines 45 and on the exposed portion of the silicon substrate 41. Insulation sidewall spacers 49 are formed on sidewalls of the wordlines 45 by a reactive ion etching process.

Subsequently, after an interlayer dielectric film 50 has been deposited on the exposed entire surface, a photolithography process and an etching process are sequentially performed on the interlayer dielectric film 50 so that contacts (51) for sources and drains are formed. The interlayer dielectric layer 50 is etched by using an etching selectivity ratio for the interlayer dielectric film 50 deposited on the insulation sidewall spacer 49 different from an etching selectivity ratio for the insulation sidewall spacer 49.

Thereafter, a silicon layer is deposited in the contacts 51 for a source and a drain, and then a chemical mechanical polishing process is performed for planarizing (not illustrated) the resultant surface of the silicon layer. A bitline is formed by depositing a bitline barrier material and a bitline material in sequence.

As described above, the related art processes have various disadvantages. According to the related art processes, after a lower portion structure of a bitline has first been fabricated, then bitline contacts are fabricated. Therefore, the bitlines are connected with the source region and the drain region through the contacts. However, when DRAM is substantially fabricated, forming a contact for the bitline in each cell is a very difficult process. Furthermore, an essential photolithography process among the various processes being used for forming contacts of memory cell is getting more and more difficult as the line width for the alignment of the contacts with the lower layer is smaller.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a semiconductor memory device fabrication method simplifying a process for fabricating the semiconductor memory device.

Another object of the present invention to provide a semiconductor memory device fabrication method that forms bitlines in the cell array.

Another object of the present invention to provide a semiconductor memory device fabrication method that can increase integration of the memory device.

Another object of the present invention to provide a semiconductor memory device fabrication method that directly forms bitlines coupled to wordlines of the device.

Another object of the present invention to provide a semiconductor memory device fabrication method omitting a process for forming contacts of bitlines in a cell array region.

To achieve at least the above objects and other advantages in a whole or in part and in accordance with purposes of the present invention, as embodied and broadly described, a method for fabricating a semiconductor memory device according to the present invention includes defining a cell array region and a peripheral circuitry region by forming a field region on a surface of a semiconductor substrate; forming a plurality of wordlines at predetermined interval in the cell array region and filling the regions demarcated by the predetermined interval with a semiconductor material to make a source region, a drain region and contacts between bit lines and capacitors; planarizing the entire resultant surfaces exposed in the cell array region and the peripheral circuitry region; directly forming bitlines without forming bitline contacts on the planarized surfaces; and forming insulation sidewall spacers on sidewalls of the bitlines so that the bitlines are insulated from each other.

To further achieve the above objects in a whole or in part, in accordance with the present invention, when a lower portion structure and an upper portion structure of a bitline of a semiconductor memory device are formed, a self aligned contact method is first used and then an elevated silicon layer is used to form the lower portion structure of the bitline.

To further achieve the above objects in a whole or in part, in accordance with the present invention, after a lower portion of the bitline of a semiconductor memory device is formed without forming the contact of the bitline, an upper portion structure can be formed on the lower portion structure of the bitline using various methods and structures.

In a first type of an upper portion structure, polysilicon is first deposited and then unnecessary portions of the polysilicon are removed. An insulation material is deposited and a chemical mechanical polishing process is performed thereon. A polysilicon plug is preferably formed by this process.

In a second type of an upper portion structure, an insulation material layer is first deposited and then unnecessary portions of the insulation material layer are removed. Polysilicon is deposited and a chemical mechanical polishing process is performed thereon. A capacitor node can be formed by this process.

In a third type of an upper portion structure, an insulation material layer is first deposited and then unnecessary portions of the insulation material layer are removed. Polysilicon is deposited and a chemical mechanical polishing process is performed. A resultant surface is planarized by this process.

In a fourth type of an upper portion structure, an oxide film is first deposited, and then unnecessary portions of the oxide film are removed. Subsequently, a lower electrode and a polysilicon layer are deposited and a chemical mechanical polishing process is performed. This process is to planarize the resultant surface and to separate a lower electrode from an upper electrode to be formed. Subsequently, an insulation layer is formed and then upper electrode is formed thereon.

To further achieve the above objects in a whole or in part, in accordance with the present invention, there is provided a method of fabricating a semiconductor memory device, the method including forming a plurality of wordlines extending along a first direction at a prescribed interval in a cell array region of a semiconductor substrate, filling regions demarcated by the prescribed interval with a semiconductor material to make source regions, drain regions and contact regions capable of connection with capacitors and bitlines, forming the bitlines to cross the wordlines in the cell array region without forming bitline contacts and forming insulation sidewall spacers on sidewalls of the bitlines to insulate the bitlines from each other.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

In this application, a preferred embodiment of a method for forming a lower portion structure of bitline using an elevated silicon layer using a photolithography process for a contact of a bitline will be described. Then, preferred embodiments of methods for forming an upper portion structure of the bitline on the lower portion structure of the bitline will be described.

FIG. 4A to FIG. 4M are diagrams that show cross sectional views and plan views illustrating a preferred embodiment of a process for forming a lower portion structure of the bitline. The first preferred embodiment forms a bitline without using a photolithography process for a contact of the bitline. FIG. 5 to FIG. 8 are diagrams that show cross sectional views and plan views illustrating preferred embodiments of processes for forming an upper portion structure of a bitline that is preferably formed on a lower portion of the bitline.

Figure 1A:
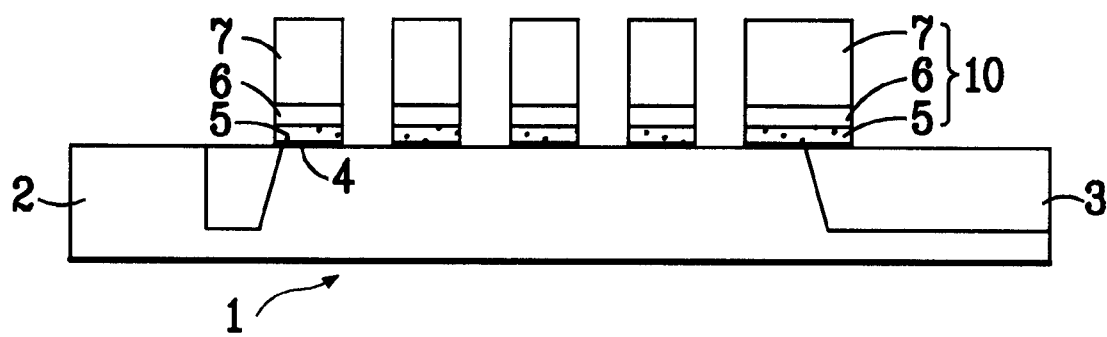
FIG. 1A to FIG. 1D are diagrams that show a related art process for forming a lower portion structure of bitline of silicon epitaxial growing type.
Figure 1B:
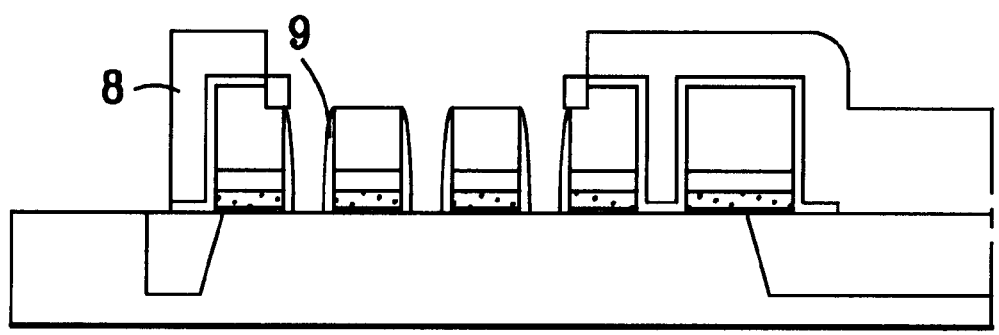
Figure 1C:
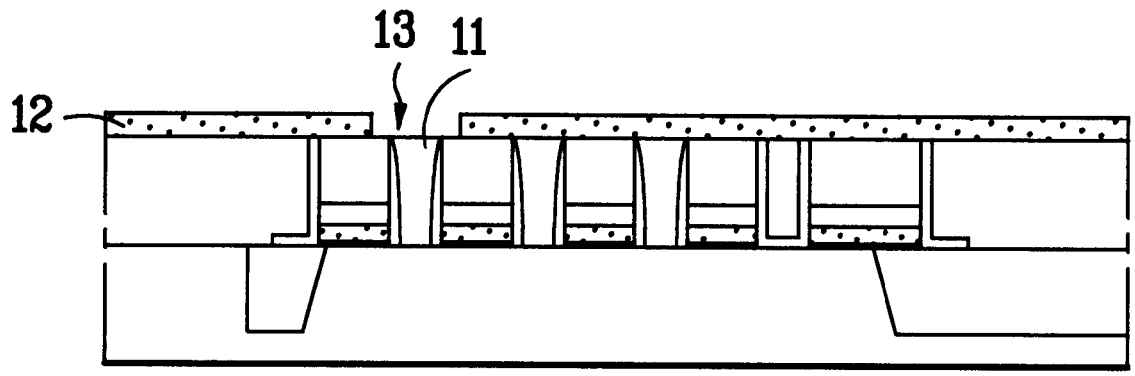
Figure 1D:
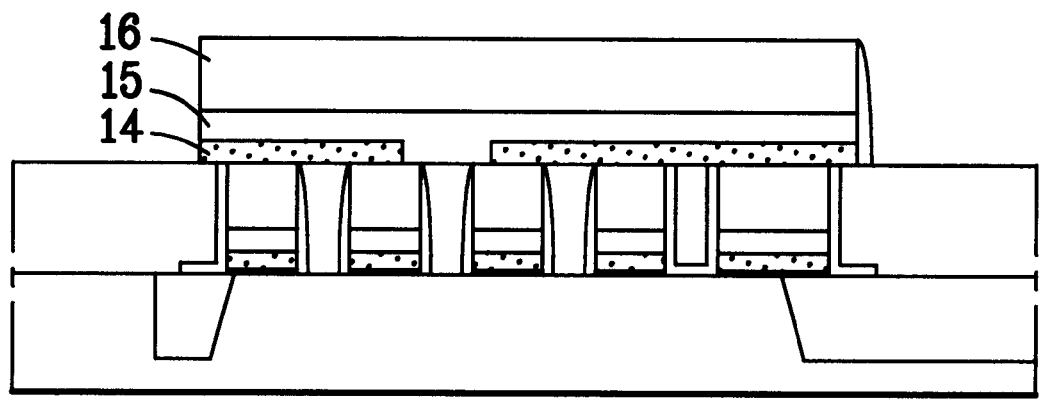
Figure 2A:
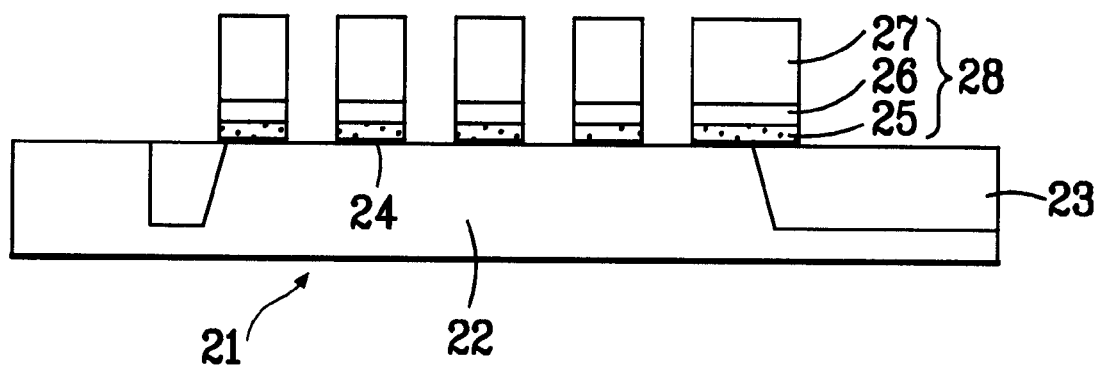
FIG. 2A to FIG. 2D are diagrams that show another related art process for forming a lower portion structure of a bitline of polysilicon plug type.
Figure 2B:
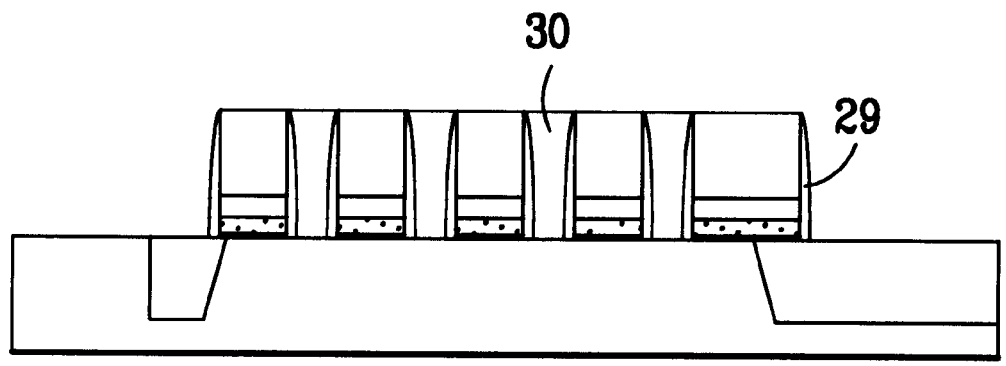
Figure 2C:
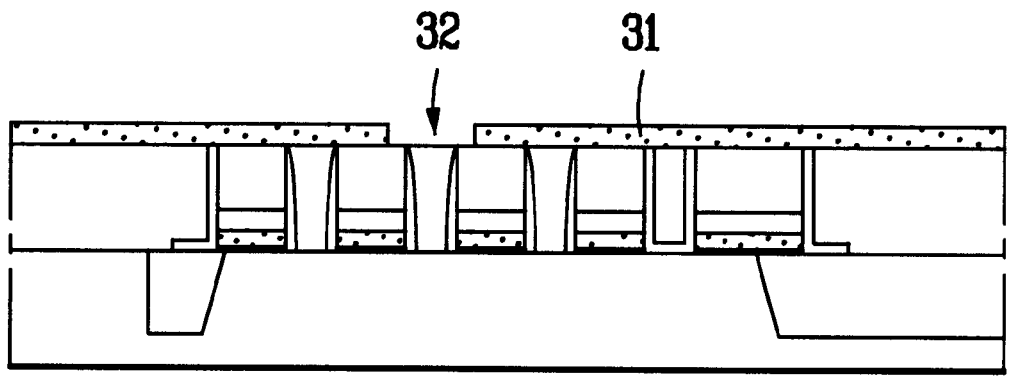
Figure 2D:
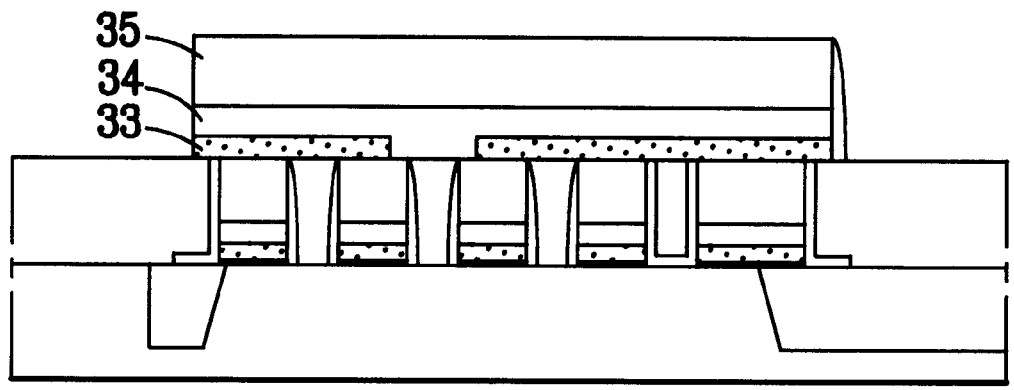
Figure 3A:
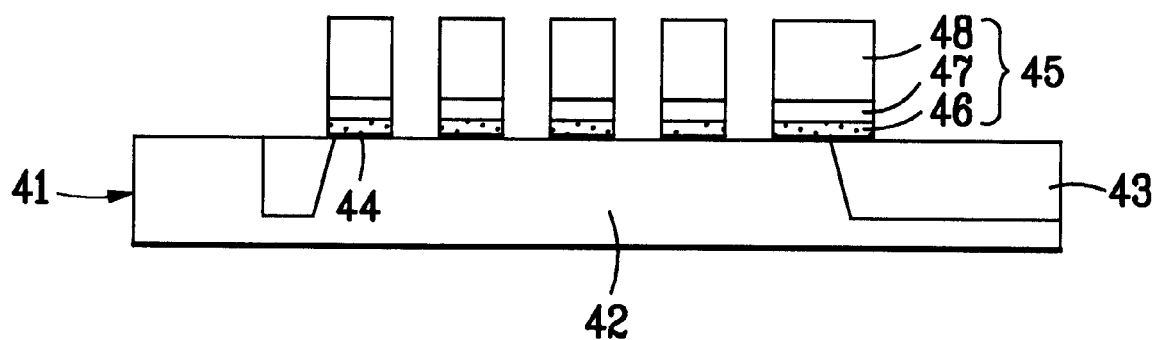
FIG. 3A to FIG. 3B are diagrams that show yet another related art process for forming a bitline structure of self-aligned contact type.
Figure 3B:
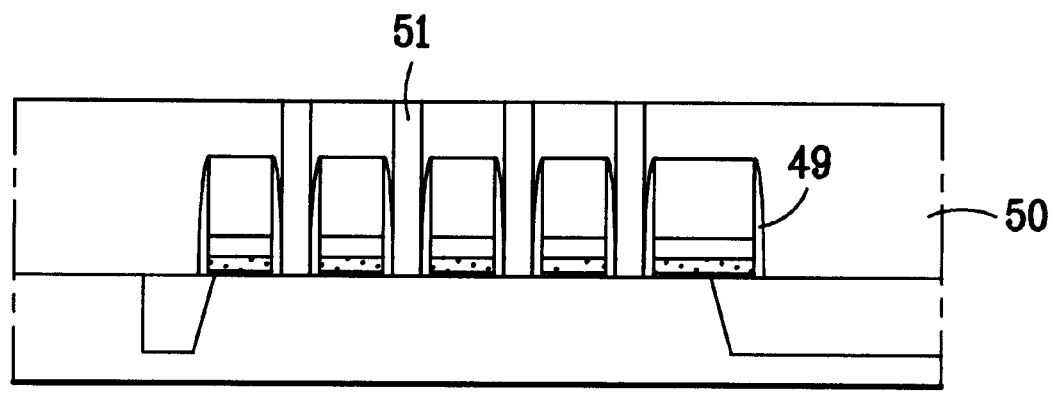
Figure 4A:
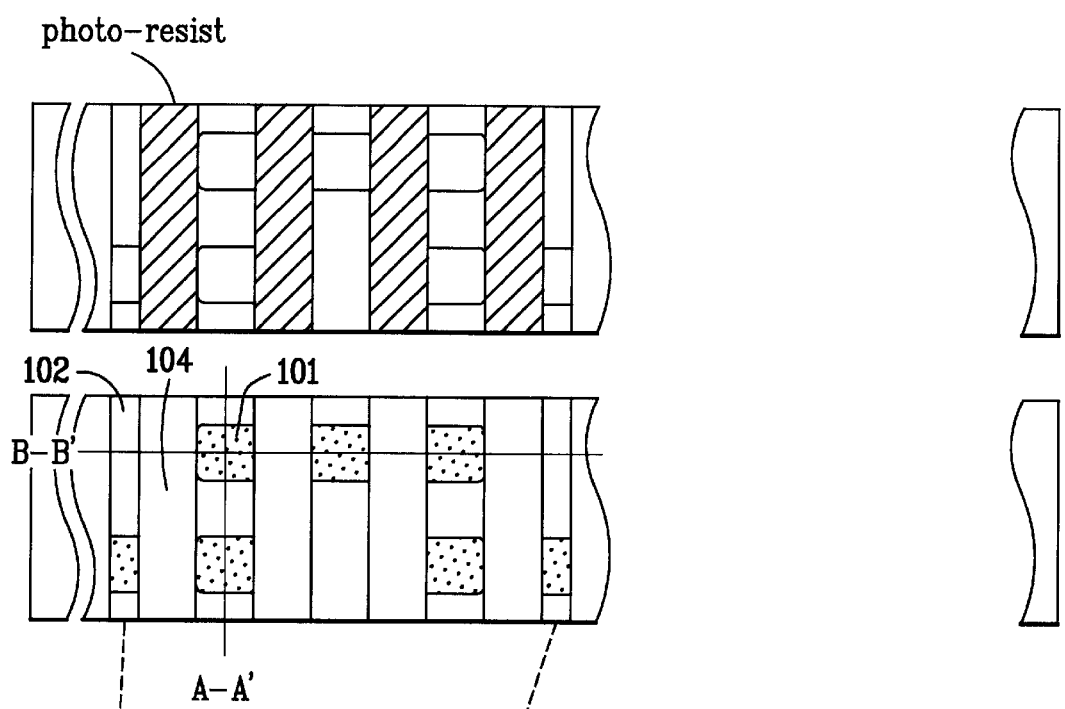
FIG. 4A to FIG. 4M are diagrams that illustrate cross sectional views and plan views illustrating processes for forming a lower portion structure of a bitline and for forming the bitline without photolithography process for forming a bitline contact in accordance with a preferred embodiment of the present invention.
Figure 4B:
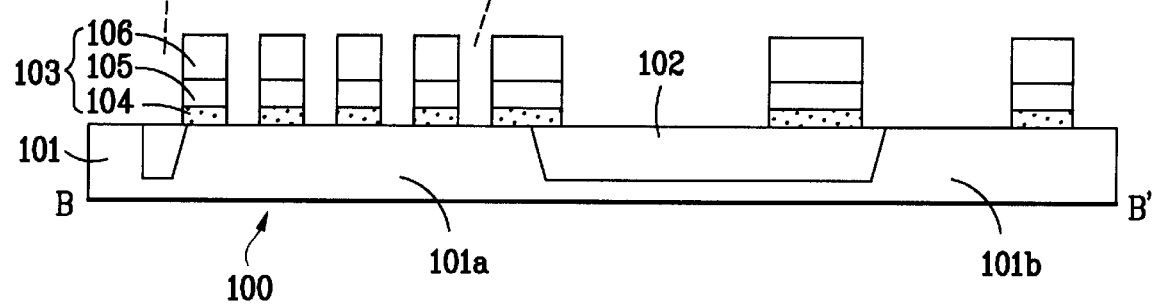

The first preferred embodiment of a process for forming a lower portion structure of the bitline will now be described. FIG. 4A is a diagram that shows a plan view, and FIG. 4B is a diagram that shows a cross sectional view taken along line B–B' of FIG. 4A. As shown in FIGS. 4A–4B, a trench isolation process is performed on a silicon substrate 100 so as to fabricate a transistor. When the trench isolation process has been performed, the silicon substrate 100 is divided into an active region 101 and a field region 102. After the trench isolation process is performed, a gate oxide film (not shown) is formed on the silicon substrate 100 preferably by a thermal oxidation process.

Subsequently, a wordline 103 is formed on the gate oxide film. A process of forming the wordline 103 will now be described. A polysilicon layer 104, a gate metal layer 105 and a wordline insulation layer 106 are sequentially deposited on the gate oxide film (not shown), and a photolithography process for the wordline 103 is performed. Accordingly, a photoresist pattern is formed on the surface of the wordline insulation layer 106. Subsequently, using the photoresist pattern as an etching mask, the wordline insulation layer 106, the gate metal layer 105 and the polysilicon layer 104 below are etched together. As the result, unnecessary portions of these layers are then removed and the wordlines 103 are formed.

As shown in the structure of FIG. 4A and FIG. 4B, the silicon substrate 100 is divided into two regions, the active region 101 and the field region 102. The field region 102 is preferably formed by etching to form a trench in the silicon substrate 100 and by filling the trench with an insulation film. The field region 102 performs an electrically isolating function for the active regions 101.

The plan view of FIG. 4A illustrates a surface of the silicon substrate 100 after the formation of the wordline, the bar-shaped portions thereof are the active region 101 in a cell array region and the other portions except the bar-shaped are the field regions 102.

In a lower portion of the drawing of FIG. 4A, a peripheral region is disposed in the regions existing in a longitudinal direction from the bars corresponding to the active regions 101. A circuit exists in this peripheral region.

FIG. 4B is a cross sectional view taken along the longitudinal line B–B' in accordance with FIG. 4A after the formation of the wordlines. In this drawing, the cell region and the peripheral circuitry region are illustrated with the field region 102.

Not illustrated, but in order to fabricate a complementary metal oxide semiconductor (CMOS) element, the isolation process is followed by a well formation process for doping an impurity on the silicon substrate 100. The gate oxide film (not shown) is formed by oxidizing the silicon substrate 100 prior to forming the wordlines.

Figure 4C:
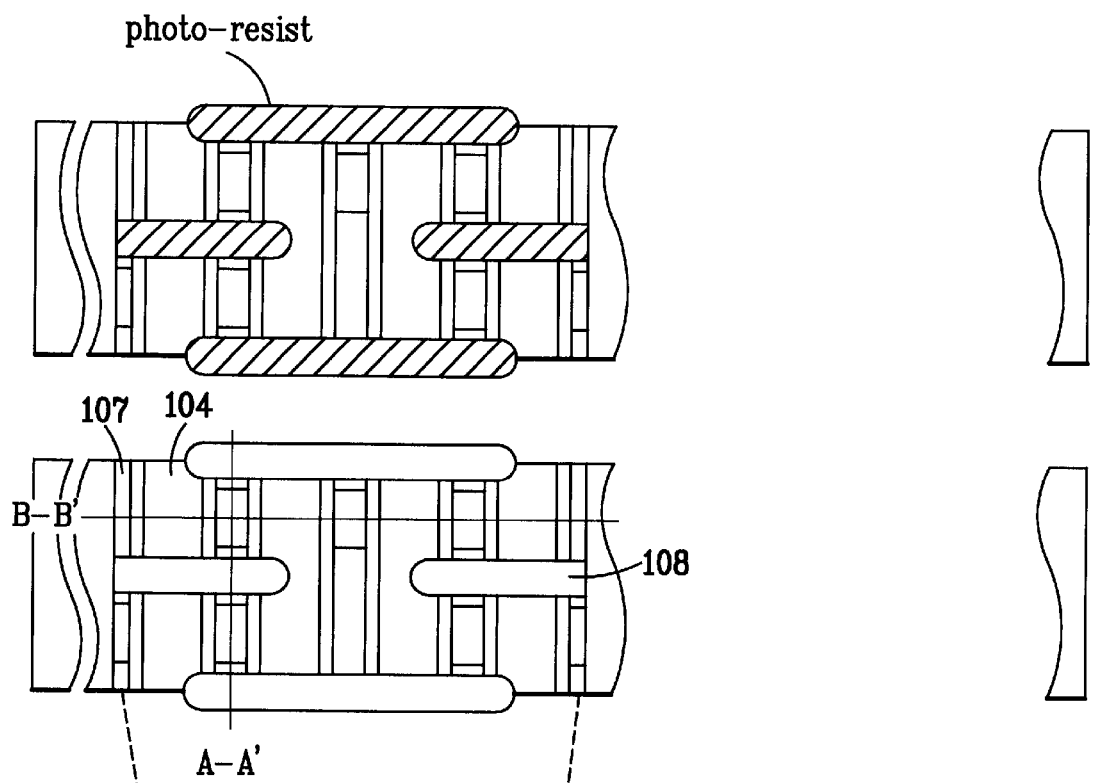
Figure 4D:
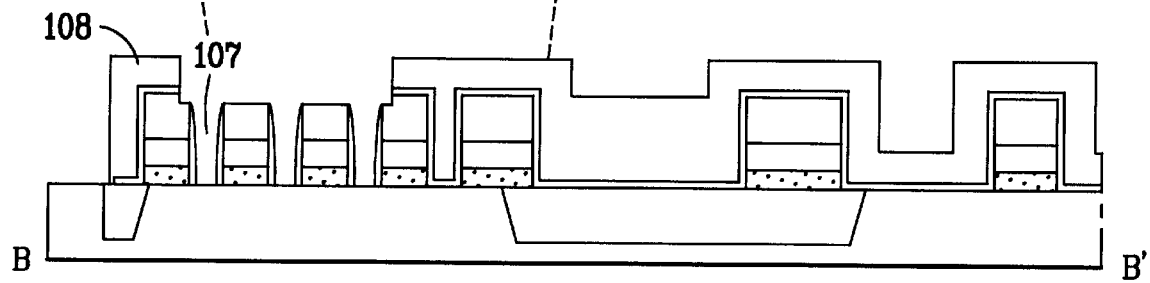

As shown in FIG. 4C and FIG. 4D, sidewall spacers 107 of the wordlines 103 in the active region (or cell array region) 101 are formed. Thereafter, an insulation layer for the elevated silicon layer 108 is deposited on exposed entire surface. On the insulation layer 108, a photolithography process and an etching process for the elevated silicon layer (ESL) are sequentially performed, and thereby, a portion corresponding to the cell array region 101a in the insulation layer 108 is removed. In this case, the insulation layer for the insulation sidewall spacers 107 in the active region 101 has an etching selectivity ratio less than the insulation layer 108. Therefore, the insulation sidewall spacers 107 are not etched while the insulation layer 108 is etched.

As shown is FIG. 4A and FIG. 4D, the wordlines 103 are formed. Thereafter, to insulate the wordlines 103 from each other, the insulation layer for forming the insulation sidewall spacers 107 is formed on each sidewall of the wordlines 103. Preferably, a reactive ion etching process is performed on the insulation layer for the spacers exposed in active region 101 so that an insulation sidewall spacer 107 is formed on each sidewall of the wordlines 103.

Subsequently, the insulation layer 108 for defining the regions in which the elevated silicon layer (ESL) is formed is deposited. First, a photolithography process is performed on the insulation layer 108 and then unnecessary portions of the insulation layer 108 are removed the portions on which the elevated silicon layer will be formed.

FIG. 4C is a diagram that shows a plan view showing the configuration for forming (i.e., to be formed) through the photolithography process and a plan view of the silicon substrate 100 prior to forming an elevated silicon layer. The insulating layer 108 on the cell array region 101a is removed and the insulation sidewall spacers 107 for insulating the wordlines 103 are formed on sidewalls of the wordlines 103. The active region 101 and the field region 102 are formed in the lower portion from which the insulation layer 108 has been removed, but the active region 101 is surrounded with a remaining portion of the insulation layer 108 and the wordlines 103.

As the result, an elevated silicon layer is preferably defined and formed by the active region 101 and the field region 102 adjacent to the active region 101. FIG. 4D is a diagram that shows a cross sectional view taken the line B–B' in accordance with FIG. 4C.

Figure 4E:
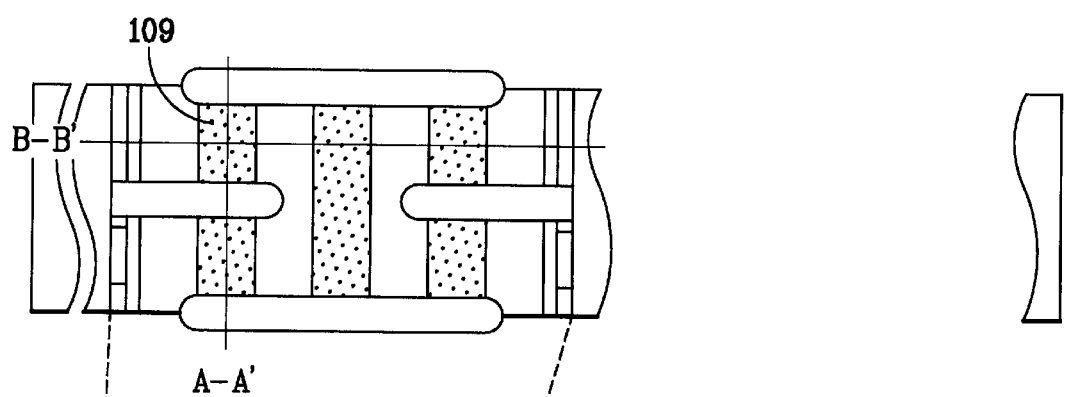
Figure 4F:
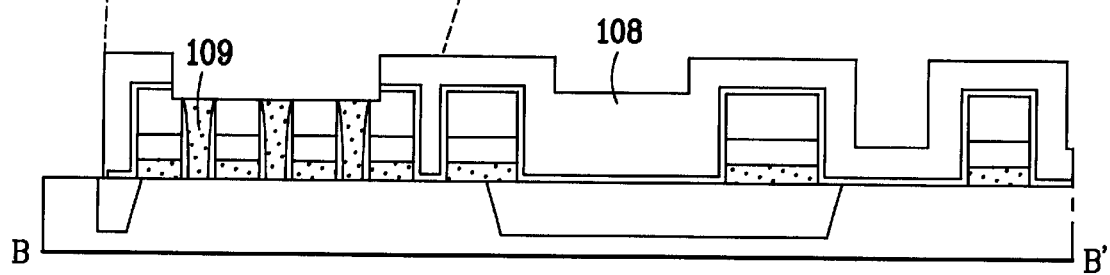

As shown in FIG. 4E and FIG. 4F, an elevated silicon layer 109 is formed within the regions between the wordlines 103 in the active region 101. FIG. 4E is a diagram that illustrates a plan view of the silicon substrate 100 after the silicon layer 109 has been formed. FIG. 4F is a diagram that shows a cross sectional view taken along the line B–B' in accordance with FIG. 4E.

The elevated silicon layer 109 preferably formed in this manner is illustrated in FIG. 4E and FIG. 4F. The elevated silicon layer 109 can be coupled with a bitline and a capacitor to be formed by subsequent processes.

On the other hand, to perform a process for forming a lightly doped drain in the peripheral circuitry region 101b, an insulation film for sidewall spacer (not shown) can be deposited on the wordline in the peripheral circuitry region. Thereafter, by using a reactive ion etching method, an insulation sidewall spacers (not shown) are formed on the sidewalls of the wordlines disposed in the peripheral circuitry region. Subsequently, a photoresist pattern for ion injection is formed by performing a photolithography process on the exposed entire surface. Using the insulation sidewall spacers and the photoresist pattern as ion injection masks, a process for injecting an impurity ion into the silicon substrate 100 is performed in order to form lightly doped drain region.

While the elevated silicon layer 109 is formed, the active region and the field region that is coupled with the active region are filled with the elevated silicon layer 109.

Figure 4G:
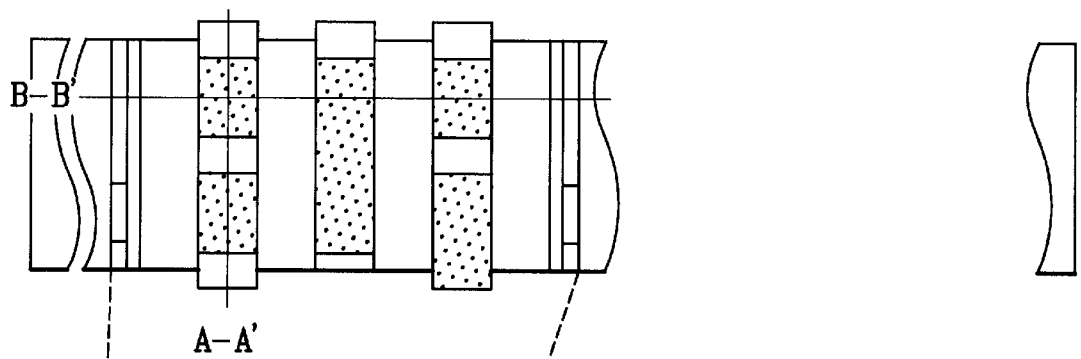
Figure 4H:
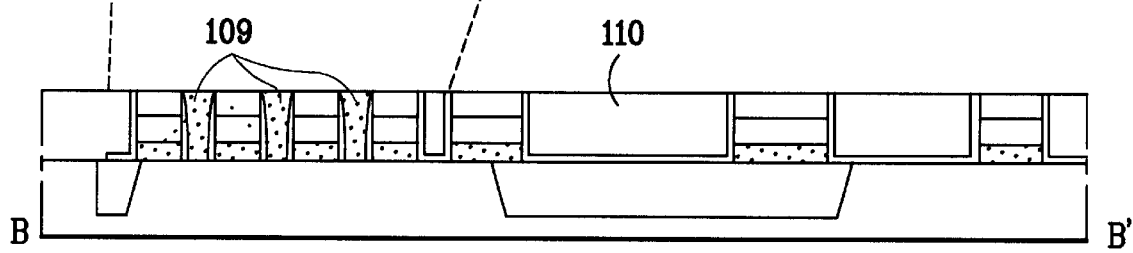

As shown in FIG. 4G and FIG. 4H, next, an insulation layer 110 is deposited on the exposed entire surface of the silicon substrate 100. Thereafter, a chemical mechanical polishing process (CMP) is preferably performed so that the wordline insulation layer 105 is exposed. As the result, the entire surface exposed on silicon substrate 100 is planarized.

Figure 4I:
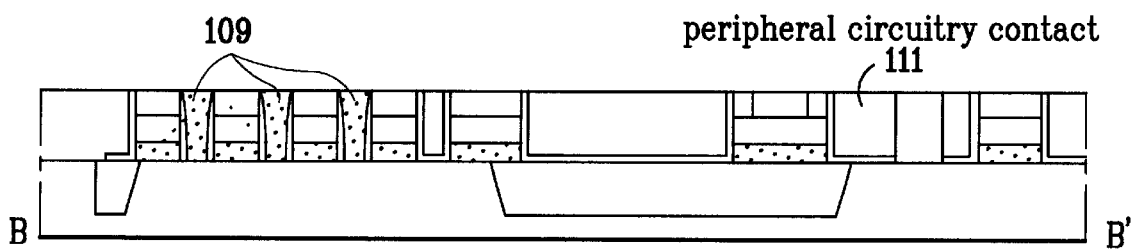

As shown in FIG. 4I, the active region 101 includes the cell array region 101a and the peripheral circuitry region 101b. In this case, the physical size of elements to be formed in the cell array region 101a are reduced in size or very small while the physical size of elements to be formed in peripheral region 101b are relatively large in comparison.

Therefore, in the cell array region 101b, it is possible to perform sequentially a photolithography process and an etching process in order to form a contact 111 in the peripheral circuitry region 101b. In other words, in the peripheral circuitry region 101b, it is possible to form the insulation film for the bitline contacts and to form the bitline. contacts on the insulation film by performing the photolithography process and the etching process like the related arts described in FIGS. 1A–3B.

For example, an insulation layer to form a drain contact, a source contact and a gate contact for a transistor is formed in the peripheral circuitry region 101b, and a photolithography process and an etching process are sequentially performed on the insulation layer. The peripheral circuitry region 101b has larger margin for a photolithography process than a cell array region 101a.

As shown FIG. 4I, the elevated silicon layer 109 that is grown in the active region 101 preferably includes three portions. Of the three portions, the middle portion is to be coupled with a bitline and two portions at both ends are to be coupled with a capacitor to be formed later. The first preferred embodiment according to the present invention has at least a distinction in the process and cell array region different from the related arts.

Figure 4J:
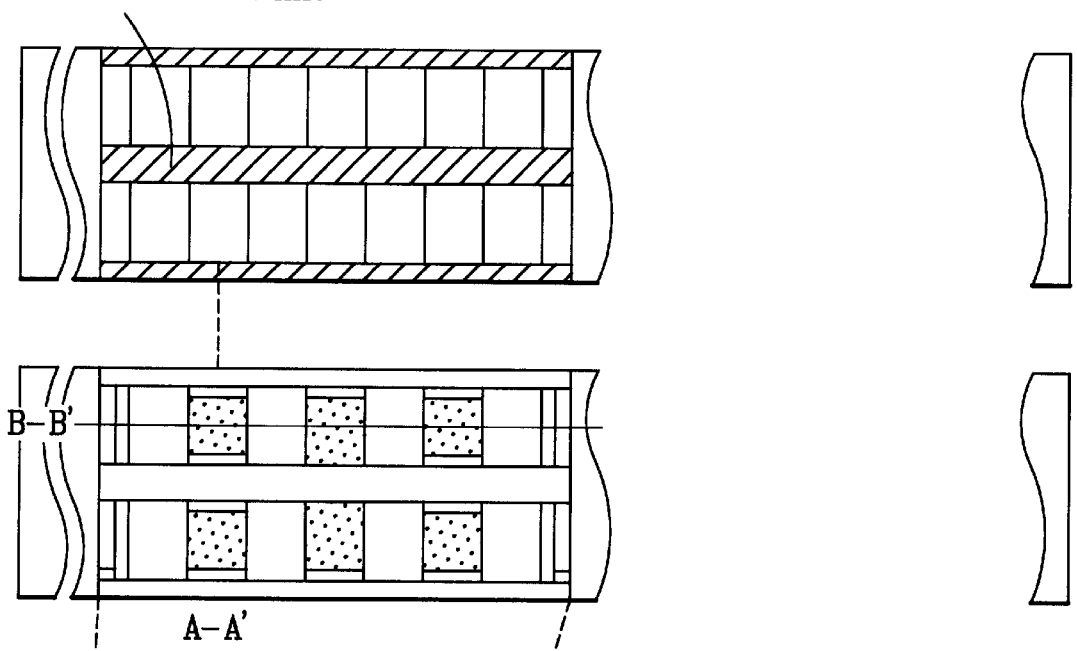
Figure 4K:
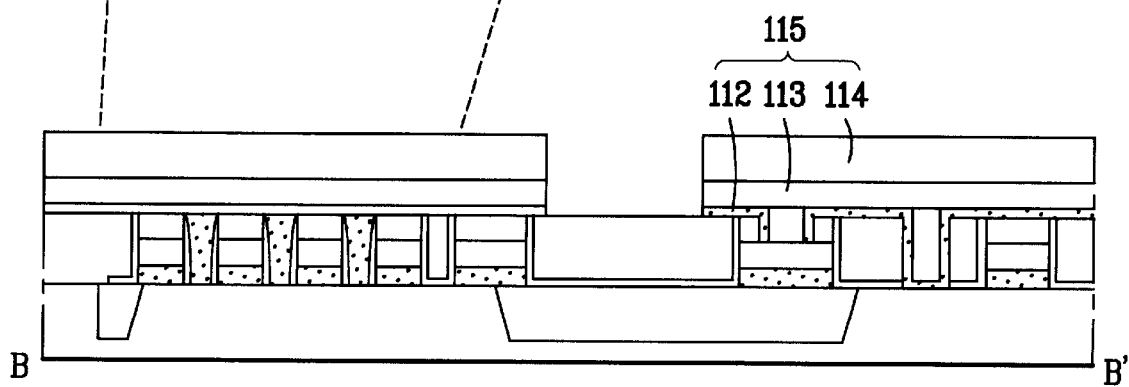

As shown in FIG. 4J and FIG. 4K, a barrier material layer 112 for bitline, a bitline material layer 113 and an insulation layer 114 is sequentially deposited. Thereafter, a photolithography process and an etching process are sequentially performed on the barrier material layer 112, the bitline material layer 113 and the insulation layer 114 in order to form bitlines 115 so that unnecessary portions except the bitlines 115 are removed.

FIG. 4K is a diagram that shows a cross sectional view taken along the line B–B' in accordance with FIG. 4J. However, FIG. 4J is diagram that shows a plan view of two dimensions so that it is difficult to simultaneously show the structures for upper layer and lower layer therein. Therefore, the barrier material layer 112 for the bitlines, the bitline material layer 113 and the insulation layer 114, which have been formed on the structure cell array region 101a, are not shown in FIG. 4J.

In other words, as shown in FIG. 4J and FIG. 4K, an etching process for completing bitlines on the structure is performed so that the bitline barrier material layer 112 and the bitline material layer 113 which are disposed at lower portions of the cell array region 101a and of the peripheral circuitry region 101b are all removed. Thus, the bitlines 115 are electrically insulated from each other.

Figure 4L:
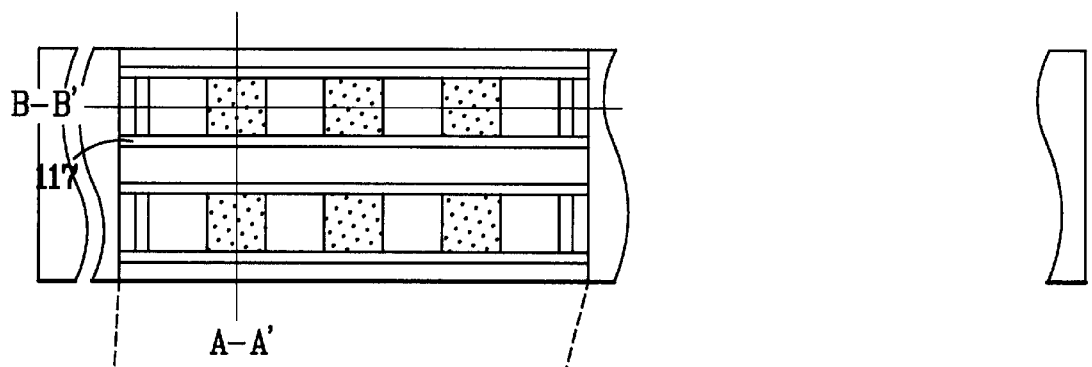
Figure 4M:
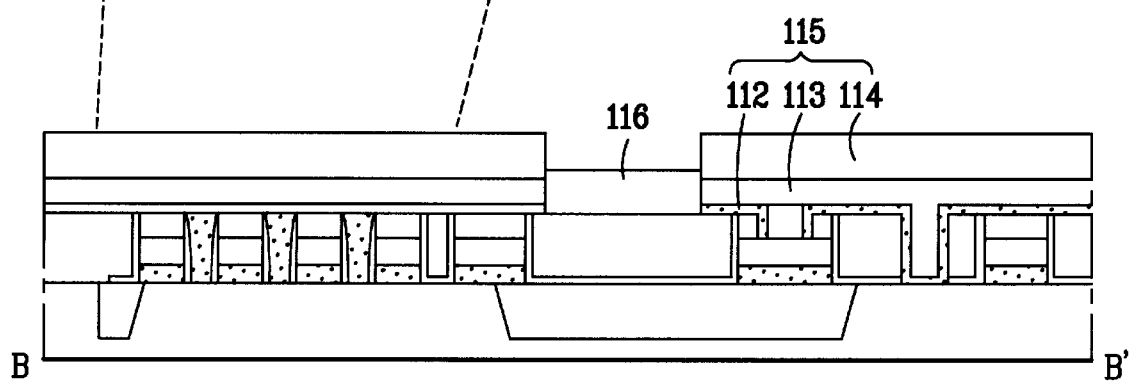

To completely insulate the bitlines 115, preferably an insulation layer 116 is deposited on the exposed entire surface. Thereafter, the insulation layer 116 is etched by a reactive ion etching method so that the insulation sidewall spacers 117 are formed on sidewalls of the bitlines 115. FIG. 4L and FIG. 4M are diagrams that illustrate processes for forming the insulation sidewall spacers 117 that insulate the sidewalls of the bitlines 115.

FIG. 5A to FIG. 8B are diagrams that illustrate plan views and cross sectional views showing four preferred embodiments for forming a capacitor on the structure as depicted in FIG. 4M.

Figure 5A:
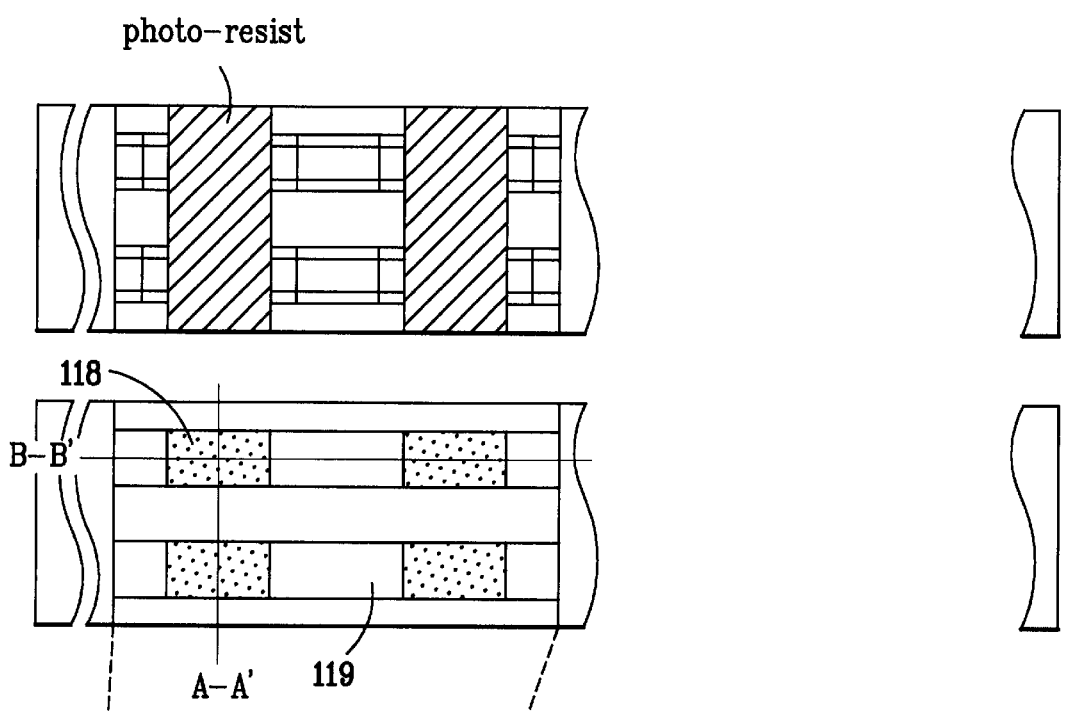
FIG. 5A and FIG. 5B are diagrams that are plan views and a cross sectional view illustrating a process for forming an upper portion structure of a bitline in accordance with another preferred embodiment of the present invention.
Figure 5B:
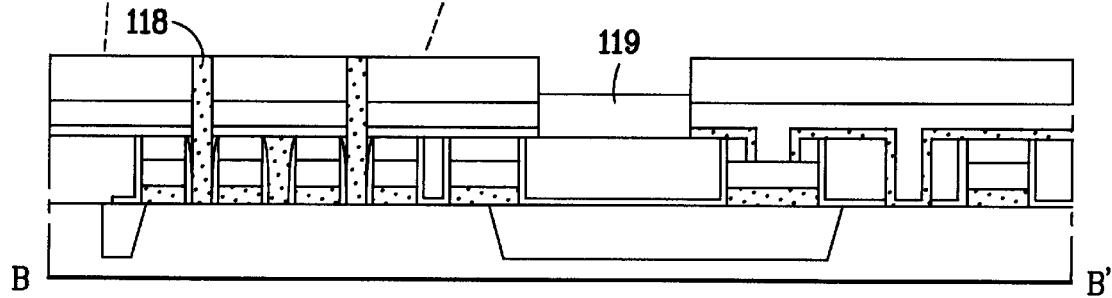

FIG. 5A and 5B are diagrams that show plan and cross sectional views illustrating a first preferred embodiment in accordance with the present invention for forming a capacitor. FIG. 5B is a cross sectional view taken along the line B–B' as depicted in FIG. 5A.

As shown in FIG. 5A and FIG. 5B, a polysilicon layer 118 is deposited on an exposed entire surface and a line photolithography process is performed on the polysilicon layer. By performing a subsequent etching process, unnecessary portions of the silicon layer between the bitlines 115 are removed.

An insulation layer 119 is deposited in the regions from which the unnecessary portions of the silicon layer between the bitlines 115, and a chemical mechanical process is performed to planarize the resultant surface of the insulation layer. Thereafter, a capacitor is formed. In other words, a deep trench (not shown) is formed between the bitlines.

In order to form a capacitor node therein, the polysilicon layer 118 is preferably deposited on the entire surface exposed in the present structure. Thereafter, the photolithography process and the etching process are performed so that unnecessary portions of the polysilicon layer 118 are removed.

Figure 6A:
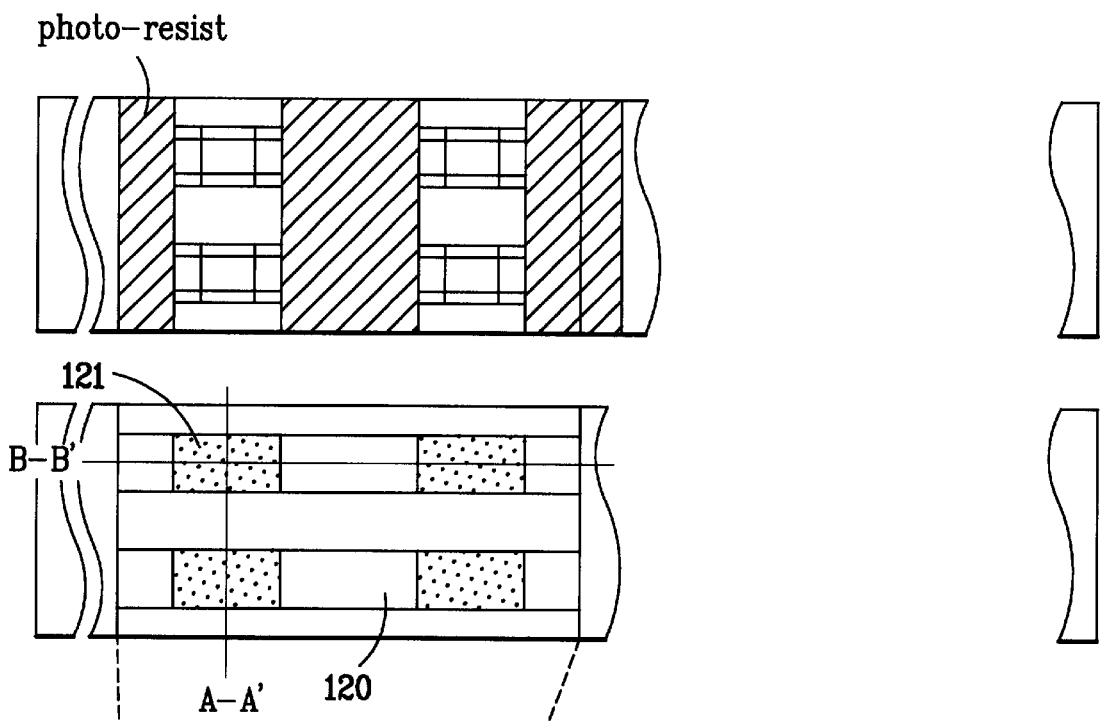
FIG. 6A and FIG. 6B are plan views and a cross sectional view illustrating a process for forming an upper portion structure of bitline in accordance with yet another preferred embodiment of the present invention.
Figure 6B:
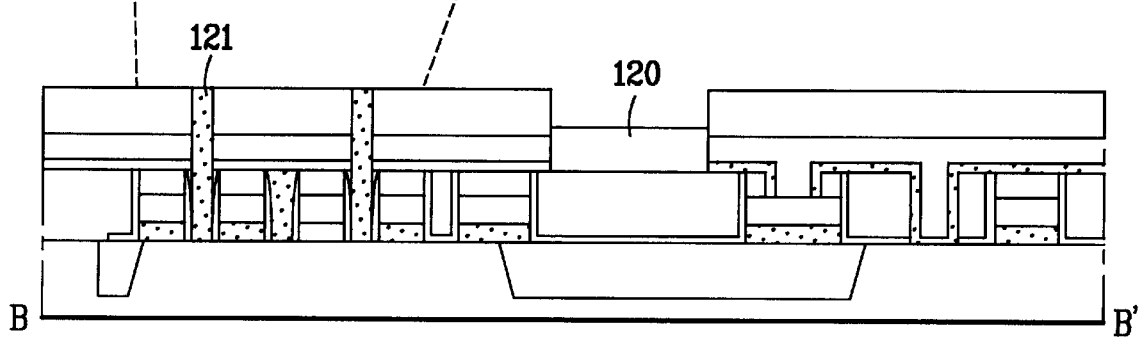

As shown in FIGS. 6A–6B, a second preferred embodiment of the present invention for forming a capacitor will now be described. FIG. 6A is a diagram that illustrates a plan view. FIG. 6B is a diagram that illustrates a cross sectional view taken along the line B–B' as depicted in FIG. 6A.

First, in the structure depicted in FIG. 4A and FIG. 4M, an insulation layer 120 is deposited. Thereafter, a line photolithography process and an etching process are sequentially performed so that unnecessary portions between the bitlines in the insulation layer 120 are removed.

Subsequently, a polysilicon layer 121 is deposited on the regions provided by the removal of unnecessary portions of the insulation layer 120. Then, the resultant surface of the polysilicon layer 121 is planarized preferably by a chemical mechanical process. A capacitor is formed thereafter.

In other words, in the structure depicted in FIG. 4L and FIG. 4M, trenches (not shown) are formed in the regions between the bitlines. In order to form a capacitor node therein, the insulation layer 120 is deposited, and preferably the line photolithography process and the etching process are performed so that unnecessary portions of the insulation layer 120 are removed.

Figure 7A:
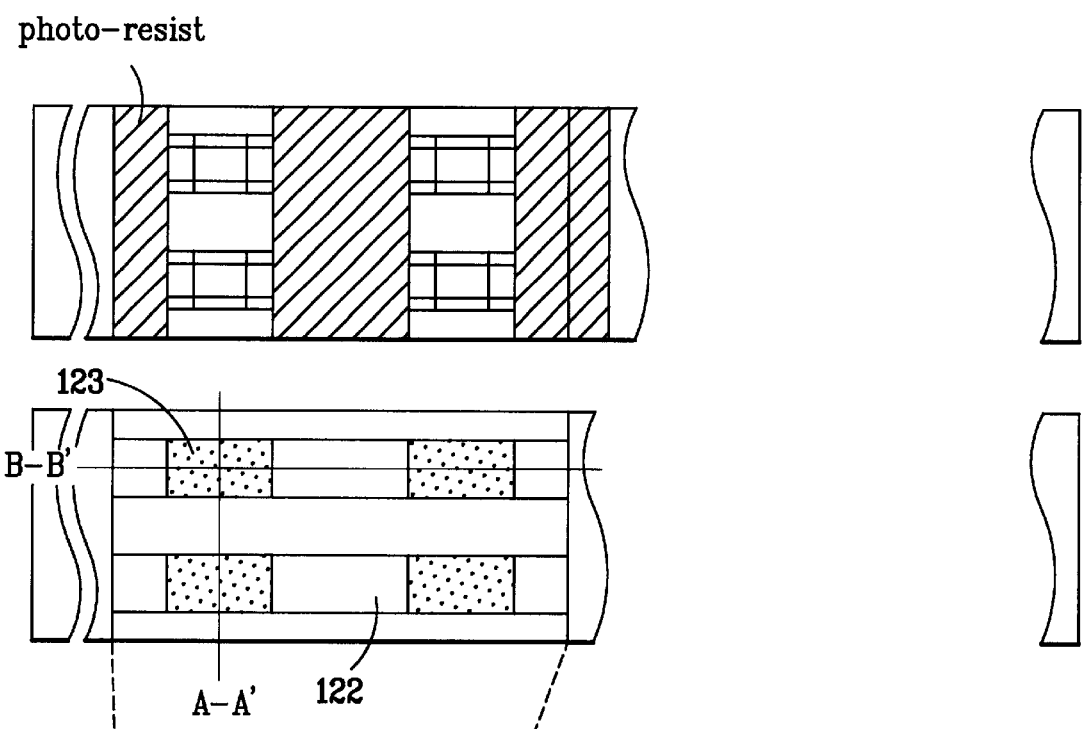
FIG. 7A and FIG. 7B are plan views and a cross sectional view illustrating a process for forming an upper portion structure of a bitline in accordance with still yet another preferred embodiment of the present invention.
Figure 7B:
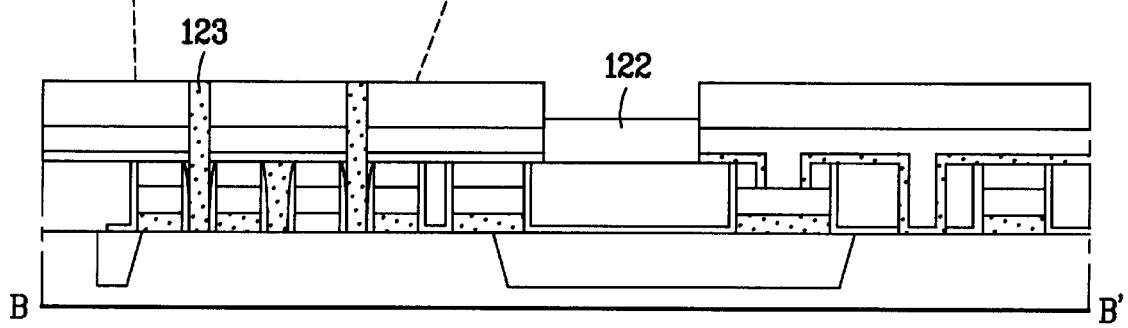

As shown in FIG. 7A and FIG. 7B a third preferred embodiment of the present invention for forming a capacitor node will now be described. FIG. 7A is a diagram that illustrates a plan view, and FIG. 7B is a diagram that illustrates a cross sectional view taken along the line B–B' as depicted in FIG. 7A.

First, an insulation layer 122 is deposited on the resultant surface provided by the processes shown in FIG. 4L and FIG. 4M. A line photolithography process and an etching process are preferably sequentially performed so that unnecessary portions of the insulation layer 122 are removed.

Subsequently, an elevated polysilicon layer 123 is preferably formed in the regions provided by the removal of the unnecessary portions of the insulation layer 122 between the bitlines. Thereafter, a chemical mechanical polishing process is performed so that the exposed resultant surface is planarized.

Thereafter, other processes for forming a capacitor are performed. In other words, trenches are formed in the regions between the bitlines, and therein the insulation layer 122 is deposited in order to form a capacitor node. Thereafter, the photolithography process and an etching process are performed so that the unnecessary portions of the insulation layer 122 are removed. As shown in FIG. 7, it is important that the elevated silicon layer 123 fills the silicon layer 123 in the regions from which the unnecessary portions are removed.

Figure 8A:
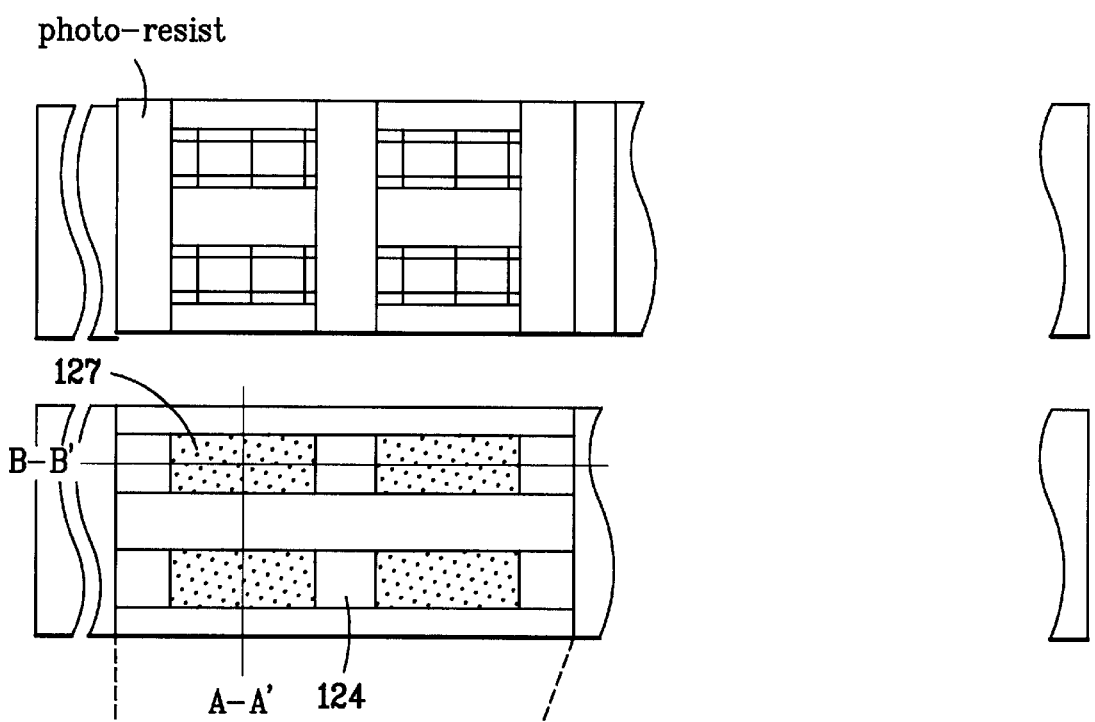
FIG. 8A and FIG. 8B are plan views and a cross sectional view illustrating a process for forming an upper portion structure of a bitline in accordance with still another preferred embodiment of the present invention.
Figure 8B:
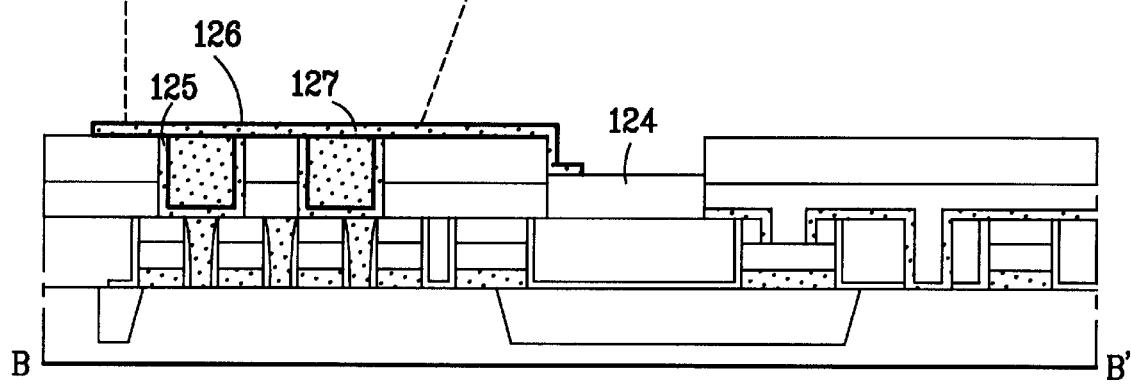

As shown in FIG. 8A and FIG. 8B, a fourth preferred embodiment of the present invention for forming a capacitor node will now be described. FIG. 8A is a diagram that shows a plan view. FIG. 8B is a diagram that shows a cross sectional view taken along the line B–B' as depicted in FIG. 8A.

First, an insulation layer 124 is deposited, and thereafter, a line photolithography process and an etching process are sequentially performed so that unnecessary portions of the insulation layer 124 between the bitlines are removed. Subsequently, a capacitor lower electrode 125 is formed in the regions provided by the removal of the unnecessary portions of the insulation layer 124.

Next, a polysilicon is deposited on the exposed entire surface, and a chemical mechanical process is performed in order to planarize the resultant surface. Subsequently, a remaining portion of the polysilicon is removed by a wet etching process. Thereafter, a capacitor insulation layer (e.g., dielectric layer) 126 is deposited on the exposed entire surface. A polysilicon layer for a capacitor upper electrode is deposited thereon. Then, a photolithography process and an etching process are sequentially performed so that the formation of the capacitor upper electrode 127 is completed.

In other words, as the result of the processes in FIG. 4L and FIG. 4M, trenches are formed between the bitlines, and the insulation layer 124 is deposited so as to directly form a capacitor. Subsequently, the photolithography process and the etching process are performed on the insulation layer 124 so that unnecessary portions of the insulation layer 124 are removed.

Thereafter, the lower electrode 125 has been formed and then the polysilicon is deposited. In order to demarcate between the capacitor lower electrode 125 and the upper electrode 127, the chemical mechanical polishing process is performed. Accordingly, the resultant surface is planarized and simultaneously, the lower electrode is separated from the upper electrode.

As described above, preferred embodiments of methods for forming a semiconductor device according to the present invention have various advantages. The preferred embodiments simplify the process for fabricating a semiconductor memory device by eliminating the process for a bitline contact.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of fabricating a semiconductor memory device, the method comprising:
    (a) defining a cell array region and a peripheral circuitry region by forming a field region in a surface of a semiconductor substrate;
    (b) forming a plurality of wordlines at a predetermined interval in the cell array region and filling regions demarcated by the predetermined interval with a semiconductor material to make a source region, a drain region and contact regions capable of connection with capacitors and bitlines;
    (c) planarizing entire surfaces exposed in the cell array region and in the peripheral circuitry region;
    (d) forming bitlines on the planarized surface without forming bitline contacts, wherein the bitlines are electrically isolated from the source, drain and contact regions; and
    (e) forming insulation sidewall spacers on sidewalls of the bitlines to insulate the bitlines from each other.

2. The method of claim 1, wherein step (c) comprises:
    forming an insulation layer on the wordlines and on the semiconductor material; and
    planarizing the resultant surface by performing a chemical mechanical polishing process on the insulation layer until the surface of the semiconductor material is exposed.

3. The method of claim 1, wherein the semiconductor material is a grown polysilicon.

4. The method of claim 1, wherein step (d) comprises:
    depositing a bitline barrier layer, a bitline material layer and a bitline insulation layer directly on the planarized surface in a sequential order; and
    forming bitlines by performing sequentially a photolithography process and an etching process on the bitline insulation layer, the bitline material layer and the bitline barrier layer.

5. The method of claim 1, wherein step (e) comprises:

forming an insulation layer on the exposed entire surface; and forming insulation sidewall spacers on sidewalls of the bitlines by performing an etching process on the insulation layer.

6. The method of claim 1, further comprising, forming contacts for connection between the bitlines and the semiconductor substrate in the peripheral circuitry region.

7. The method of claim 6, wherein the forming contacts for connection between the bitlines and the semiconductor substrate in the peripheral circuitry region occurs between steps (c) and (d).

8. The method of claim 1, further comprising:

depositing a semiconductor layer on the entire surface including the bitlines; forming a capacitor node by performing a photolithography process on the semiconductor layer and removing a remaining portion of the semiconductor layer on which a capacitor node is not provided;

depositing an insulation layer on the exposed entire surface; and planarizing the resultant surface by performing a polishing process on the insulation layer.

9. The method of claim 8, wherein the semiconductor layer is a polysilicon layer and the insulation layer is an oxide film layer, wherein the remaining portion of the semiconductor layer is removed by a wet etching process, and wherein the depositing the semiconductor layer occurs after the step (e).

10. The method of claim 1, further comprising:

forming an insulation layer on the exposed entire surface including the bitlines and the insulation sidewall spacers of the bitlines;

removing portions of the insulation layer necessary to define a geometry of a semiconductor layer by sequentially performing a photolithography process and an etching process on the insulation layer;

depositing the semiconductor layer on the exposed entire surface including a remaining portion of the insulation layer; and planarizing the resultant surface by performing a polishing process on the semiconductor layer.

11. The method of claim 10, wherein the insulation layer is an oxide film layer and the semiconductor layer is a polysilicon layer.

12. The method of claim 1, further comprising:

forming an insulation layer on the exposed entire surface including the insulated bitlines;

removing portions of the insulation layer necessary to define a geometry of a semiconductor layer by sequentially performing a photolithography process and an etching process on the insulation layer to form a capacitor node;

growing the semiconductor layer in the regions from which the portions of the insulation layer are removed; and planarizing the resultant surface by performing a polishing process on the semiconductor layer.

13. The method of claim 12, wherein the insulation layer is an oxide film layer and the semiconductor layer is a grown polysilicon layer.

14. The method of claim 1, further comprising:

depositing an insulation layer on the exposed entire surface including the bitlines and insulation sidewall spacers of the bitlines;

removing portions of the insulation layer necessary to define a geometry of a capacitor lower electrode by sequentially performing a photolithography process and an etching process;

forming the capacitor lower electrode in the region from which the portions of the insulation layer are removed and depositing a semiconductor layer on the entire surface including the lower electrode;

planarizing the resultant surface by performing a polishing process on the semiconductor layer;

removing a remaining portion of the semiconductor layer and depositing a capacitor dielectric layer on the exposed entire surface;

depositing a material layer for capacitor upper electrode on the capacitor dielectric layer; and completing the formation of the capacitor upper electrode by performing a photolithography process and an etching process on the material layer for the capacitor upper electrode.

15. The method of claim 14, wherein the semiconductor layer and the material layer for the upper electrode are polysilicon layers and the insulation layer is an oxide film layer.

16. The method of claim 14, wherein the remaining portion of the semiconductor layer is removed by a wet etching process.

17. The method of claim 1, wherein the semiconductor substrate is a silicon substrate.

18. The method of claim 1, wherein the forming the field region comprises: forming a trench by etching the semiconductor substrate; and filling the trench with an insulation material.

19. The method of claim 18, wherein the insulation material is an oxide.

20. A method of fabricating a semiconductor memory device, the method comprising:

forming a plurality of wordlines extending along a first direction at a prescribed interval in a cell array region of a semiconductor substrate;

filling regions demarcated by the prescribed interval with a semiconductor material to make source regions, drain regions and contact regions capable of connection with capacitors and bitlines;

forming the bitlines to cross the wordlines in the cell array region without forming bitline contacts; and forming insulation sidewall spacers on sidewalls of the bitlines to insulate the bitlines from each other.

21. The method of claim 1, wherein the bitlines have a barrier material layer, a metal layer and a insulating layer, further comprising the step of forming an electrical contact between the metal layer of the bitlines and one of the source, drain, or contact regions, wherein the electrical contact is formed through the insulating layer of the bitlines.

22. The method of claim 1, further comprising the step of forming electrical contact between the bitlines and one of the source, drain, or contact regions, wherein the electrical contact is formed subsequent to step (d).

* * * * *